United States Patent
Telser et al.

(10) Patent No.: US 6,326,128 B1
(45) Date of Patent: *Dec. 4, 2001

(54) PRODUCTION OF A PHOTOSENSITIVE RECORDING MATERIAL

(75) Inventors: Thomas Telser, Weinheim; Stefan Wegener, Mainz; Sabine Philipp, Mörfelden-Walldorf; Manfred Zürger, Sinsheim, all of (DE)

(73) Assignee: BASF Drucksysteme GmbH (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/042,573

(22) Filed: Mar. 17, 1998

(30) Foreign Application Priority Data

Mar. 20, 1997 (DE) .............................. 197 11 696

(51) Int. Cl.$^7$ ...................................... G03F 7/11
(52) U.S. Cl. .................. 430/306; 430/271.1; 430/273.1; 430/256; 430/937
(58) Field of Search ................. 430/270.1, 306, 430/273.1, 281.1, 256, 937

(56) References Cited

U.S. PATENT DOCUMENTS

| 4,072,527 | | 2/1978 | Fan ............................................ 96/87 |
|---|---|---|---|
| 4,162,919 | | 7/1979 | Richter et al. ............................ 96/87 |
| 4,460,675 | * | 7/1984 | Gruetzmacher et al. ............. 430/300 |
| 5,039,592 | * | 8/1991 | Umeda .................................. 430/271 |
| 5,069,999 | | 12/1991 | Higashi et al. ....................... 430/272 |
| 5,175,072 | * | 12/1992 | Martens ................................ 430/254 |
| 5,407,781 | * | 4/1995 | Feinberg et al. ..................... 430/271 |
| 5,468,596 | * | 11/1995 | Loerzer et al. ...................... 430/306 |
| 5,484,684 | * | 1/1996 | Telser et al. ........................... 430/253 |
| 5,679,485 | * | 10/1997 | Suzuki et al. ........................... 430/18 |
| 5,725,991 | * | 3/1998 | Gries .................................... 430/258 |
| 5,888,701 | * | 3/1999 | Fan ....................................... 430/306 |
| 6,074,807 | * | 6/2000 | Eichorst et al. ...................... 430/529 |

FOREIGN PATENT DOCUMENTS

| 3825782 | | 7/1988 | (DE) . |
|---|---|---|---|
| 084 851 | | 8/1983 | (EP) . |
| 231112 | | 8/1987 | (EP) . |
| 05 142 777 | * | 6/1993 | (EP) . |
| 753415 | | 1/1997 | (EP) . |
| 05142777 | | 6/1993 | (JP) . |

* cited by examiner

Primary Examiner—Janet Baxter
Assistant Examiner—Barbara Gilmore
(74) Attorney, Agent, or Firm—Keil & Weinkauf

(57) ABSTRACT

A process for the production of a photosensitive recording material for producing relief printing plates is described, in which a photosensitive layer is laminated with a composite element comprising a protective cover sheet, a release layer and, if required, a further layer, wherein the surface of the uppermost layer of the composite element or the surface of the photosensitive layer is subjected to a corona treatment immediately before contact. As a result of the corona treatment, the adhesion of the applied layer is substantially increased.

16 Claims, No Drawings

PRODUCTION OF A PHOTOSENSITIVE RECORDING MATERIAL

The present invention relates to a process for the production of a photosensitive, in particular photopolymerizable, recording material, especially for the production of relief printing plates, for example of flexographic printing plates, which is composed of a dimensionally stable substrate or of a substrate film, if required an adhesion-promoting layer, at least one photosensitive, in particular photopolymerizable, layer, a nonphotosensitive release layer and a removable protective cover sheet. The various layers are applied to the substrate or the protective cover sheet in a suitable manner, for example by coating with a solution of the components and drying, by application of a melt or by lamination under pressure and, if required, heat.

In the production of letterpress printing plates, it is usual to dissolve the components of the photosensitive layer in a suitable solvent and to pour the solution onto a preproduced laminate of protective cover sheet and release layer. After the photosensitive layer has been dried, the laminate is finally laminated with a substrate film coated with a mixture of adhesive-forming components.

In the production of flexographic printing plates, it is usual to melt the components of the photosensitive layer in an extruder and to mix them thoroughly. The melt is then discharged through a slot die and introduced into the gap of a calender. The protective cover sheet laminated with the release layer is fed in over one roll of the calender while the substrate film coated with the mixture of adhesion-promoting components is fed in over the second roll of the calender. In the calender gap, the photosensitive melt is laminated with the composite elements comprising protective cover sheet/release layer and mixture of adhesion-promoting components/substrate film.

In processing the printing plate, the protective cover sheet must be removed without the layers underneath being detached from their laminate. In particular, the release layer must remain completely on the photosensitive layer. If, in the preferred embodiment of the production process, the release layer is first applied to the protective cover sheet from solution and dried and the laminate is then combined with the molten, photosensitive layer by calendering, removal of the protective cover sheet from the release layer frequently gives rise to adhesion problems since in some cases the release layer adheres better to the protective cover sheet than to the photo-sensitive layer.

For good processibility of the printing plate, however, there must be a reliably reproducible difference in adhesion between release layer and photosensitive layer on the one hand and release layer and protective cover sheet on the other hand. The same applies to laminates which contain, for example, additional layers. Such materials are described, for example, in EP-A 84 851 and 456 336. Here, the additional layers are produced separately and then combined with the rest of the laminate by lamination or calendering. If the adhesion between the photosensitive layers is insufficient here, this leads during washout, in particular in parts with fine relief structures, to image defects which give poor or even non-printing plates.

It is an object of the present invention to provide a process for the production of a photosensitive recording material, in particular for the production of relief printing plates, which gives multilayer printing plates whose layers have exactly and reproducibly adjustable adhesion to one another and to substrates and to protective cover sheets so that it is possible reliably to remove parts of the multilayer material, in particular temporary protective cover sheets, without unintentional separation in other parts, ie. between other layers.

We have found that this object is achieved, according to the invention, by a process for the production of a photopolymerizable recording material for the production of relief printing plates, in which a photosensitive layer is laminated with a composite element comprising a removable protective cover sheet, a release layer and, if required, a further layer. In the novel process, the surface of the uppermost layer of the composite element or the surface of the photosensitive layer is subjected to a corona treatment immediately before contact.

Preferably, the photosensitive layer is applied as a melt or from a solution to the composite element comprising protective cover sheet, release layer and any further layer. In this case, the uppermost layer of the composite element is usually subjected to a corona treatment.

The release layer applied to the protective cover sheet, as the uppermost layer, is preferably subjected to the corona treatment.

As a result of this treatment, the adhesion between the release layer and the photosensitive layer is increased substantially and so uniformly that, on removal of the protective cover sheet from the release layer, the latter remains bonded completely on the layer underneath, without any defects.

If it is intended to produce a printing plate, in particular a flexographic printing plate, which contains more than one photosensitive layer, the abovementioned composite element may also carry a photosensitive layer on the nonphotosensitive release layer. Said photosensitive layer need not be photosensitive from the beginning; it is sufficient if a layer which contains only a polymeric binder but no polymerizable compound and no photo-initiator is initially applied. During storage of the plate, when this layer is in contact with the other photosensitive layer, its low molecular weight components, such as polymerizable compounds and photoinitiators, can diffuse into the polymer layer and render the latter photosensitive too.

If such a layer is intended, it is generally applied as a solution to the release layer and is dried. Of course, the components of the release layer and the solvent of the additional layer should be chosen so that the release layer is dissolved only to a slight extent, if at all. It is also possible to apply the additional layer from a dispersion in a solvent, for example water, in which the release layer is insoluble. The additional layer generally has a thickness of from about 20 to 200 $\mu$m. If it has a certain minimum thickness, for example about 50 $\mu$m, the additional layer too may be applied from the melt by extrusion and calendering. Before the application of the additional layer, the surface of the release layer can also be corona-treated according to the invention, particularly if the additional layer is applied by calendering.

Very generally, in the production of a multilayer laminate, each layer surface with which another layer is to be firmly bonded can be corona-treated by the novel process. It is important that the corona treatment be carried out immediately before the application of the layer, ie. within from about 1 to 3000, preferably from about 60 to 600, seconds before this step. This can be achieved on a large industrial scale particularly advantageously by a continuous production process in which, before the coating station or before entering the calender gap, the strip to be coated passes a corona station in which the corona treatment is thus carried out in-line.

A thin adhesion-promoting layer may furthermore be provided below the photosensitive layer, on the substrate which usually remains permanently bonded to the layers present thereon.

The photosensitive layer or the photosensitive layers is or are usually negative-working, ie. it or they are cured by exposure to light. This can be effected by photocrosslinking of preproduced polymers or by photopolymerization of low molecular weight polymerizable compounds. Photopolymerizable layers essentially contain a polymeric binder which can be washed out in a developer, an ethylenically unsaturated compound capable of free radical polymerization and a polymerization initiator which can be activated by actinic radiation, in particular long-wave ultraviolet or short-wave visible light. The composition of such layers is known and is described, for example, in DE-A 24 56 439, EP-A 84 851 and 456 336 or U.S. Pat. No. 4,072,527. Elastomers, for example block copolymers having rigid polymer blocks, for example of styrene/acrylonitrile or acrylate units, and resilient blocks of diene polymers, for example of butadiene or isoprene, are particularly advantageously used as binders.

In general, the polymerizable compounds used are those having terminal ethylenically unsaturated groups, in particular those which are activated by neighboring polar groups, for example carbonyl, carboxyl, ester or carboxamido groups. Esters and amides of acrylic or methacrylic acid are particularly preferred.

The photoinitiators used are the compounds usually employed for photopolymerizable mixtures. Examples are stated in the abovementioned publications.

The layer may furthermore contain conventional additives, for example thermal polymerization inhibitors, dyes, photochromic substances, antioxidants or plasticizers.

The photopolymerizable layers contain in general from 60 to 95, preferably from 70 to 95,% by weight of a binder, from 5 to 40, preferably from 5 to 30,% by weight of polymerizable compounds and from 0.01 to 10, preferably from 0.1 to 5,% by weight of photoinitiator, based on the total amount of binder and polymerizable compounds. They have in general a thickness of from 50 to 7000 $\mu$m, preferably from 200 to 3000 $\mu$m.

The function of the release layer, which is applied to the protective cover sheet, is to eliminate the tack of the printing plate surface and to facilitate handling of the plate during contact printing. It generally has a thickness of from 0.1 to 10 $\mu$m. Suitable release layer materials are polyamides, ethylene/vinyl acetate copolymers, partially hydrolyzed polyvinyl acetates and other thermoplastic polymers. The release layer should be soluble in the developer.

A thin adhesion-promoting layer, for example of a commercial one- or two-component adhesive, is frequently applied to the substrate in a known manner for better anchoring of the photosensitive layer.

This layer generally has a thickness of from 0.5 to 30 $\mu$m, preferably from 1 to 10 $\mu$m, and may consist of polyurethane- or polychloroprene-based adhesives.

The substrate is generally a flexible, dimensionally stable foil or film, for example of metal or plastic. Suitable plastics films include polyester films, for example comprising polyethylene terephthalate, which are preferably biaxially oriented and heat-set. The thickness of the film is in general from 50 to 300 $\mu$m, preferably from 75 to 200 $\mu$m.

The protective cover sheet may consist of the same material as the substrate or the substrate film. If the contact exposure of the printing plate is effected through the protective cover sheet, the latter must be transparent. It usually has a thickness in the same range as the substrate film but may also be thinner than it.

For the production of the photosensitive printing plate, a substrate film is preferably first provided with an adhesion-promoting layer and then coated with a photosensitive layer. Coating is frequently effected from a solution, which is then dried to give the solid layer. It may also be effected from the melt by melting and homogenizing the photosensitive mixture in an extruder and then discharging it through a slot die and feeding it into the gap of a calender. The soft to viscous material is combined there with the substrate film primed with a mixture of adhesive-forming components. At the same time, the protective cover sheet coated with the release layer may be fed in from the opposite side of the photosensitive layer and combined therewith. Before the combination of the two layers, the protective cover sheet with the applied release layer is fed through a corona station. If an additional photosensitive layer is applied to the release layer, the release layer too may be subjected beforehand to a corona treatment, but in any case when the additional layer is applied by calendering. In this case, a corona treatment should be carried out before both calendering steps. Furthermore, the surface of the substrate film or of the adhesion-promoting layer applied thereon can if required be subjected to a corona treatment before the application of or the combination with the photosensitive layer.

The printing plate thus produced is processed in a known manner. The photosensitive layer is provided with an image by contact exposure under a photographic transparency, exposure being effected through the protective cover sheet or, after removal of this sheet, only through the release layer. The exposed printing plate is developed by being washed out, the release layer and the unexposed parts of the photosensitive layer(s) being removed. Depending on the nature of the photosensitive layer, especially its binder, suitable developers are organic solvents, mixtures of water and organic solvents or aqueous solutions, for example aqueous alkaline solutions.

Exact copies of the photographic transparency are obtained in every case since the protective cover sheet can be readily removed from the release layer without damaging the latter.

The efficiency of the novel corona treatment is dependent on the next layer being applied immediately to the corona-treated surface. If the layer having the corona-treated surface is stored for a long time and only then provided with the further layer, the adhesion is only slightly improved, if at all. Surprisingly, the improvement in adhesion is independent of whether the subsequent coating is effected from solution, from the melt or by lamination or calendering. In particular, the adhesion-improving effect of the corona treatment is not impaired if the corona-treated layer softens or even melts, for example during calendering.

In the Examples which follow and illustrate the invention, amounts and percentages are by weight, unless stated otherwise.

EXAMPLE 1

A 125 $\mu$m thick polyethylene terephthalate protective cover sheet of the type Lumirror® X 43 (Toray Industries, Inc.) was coated with a release layer of polyamide (Makromelt® 6900; Henkel KG a.A.) in a layer thickness of 5 $\mu$m and was rolled up.

A photosensitive mixture of

| | |
|---|---|
| 80 parts | of a styrene/isoprene/styrene block copolymer (Kraton ® D 1107; Shell Oil Co.) |
| 5 parts | of hexanediol dimethacrylate, |
| 5 parts | of hexanediol diacrylate, |
| 7 parts | of liquid paraffin (white oil S 5000) |
| 1 part | of paraffin wax, |
| 1 part | of benzil dirnethyl ketal, |
| 1 part | of 2,6-di-tert-butyl p-cresol and |
| 0.006 part | of Sudan Black (C.I. 26 150) | was extruded in a twin-screw extruder (ZSK 53) with a throughput of 30 kg/h at a melt temperature of 130° C. and discharged through a slot die. The melt discharged through the die was fed into the gap of a two-roll calender. Both rolls of the calender were heated. The temperature of the rolls was 80° C. A 125 μm thick polyethylene terephthalate film (Mylar®) coated with a mixture of adhesive-forming components was fed in over the upper calender roll while the protective cover sheet coated with the polyamide release layer was introduced over the lower calender roll. As soon as the protective cover sheet came into contact with the calender roll, the polyamide release layer melted; the surface was tacky. Substrate films with a mixture of adhesive-forming components, photosensitive melt and protective cover sheet with release layer were then bonded to one another in the calender gap. The laminate was taken off on a suction belt, cooled and fabricated.

A corona treatment station from Kalwar was installed between the feed means for the protective cover sheet and the calender. The corona treatment station had a power of 3 kW. Metal electrodes were used. The protective cover sheet to be treated, including release layer, was fed past the electrodes at a distance of about 1 mm, over a rubber roll. The width of the sheet was 50 cm and the web speed was 60 cm/min. The current of the corona treatment was varied from 0 mA through 100 mA to 200 mA. The protective cover sheet was unrolled. The side of the sheet adjacent to the release layer was then corona-treated. Thereafter, the sheet was deflected twice (once with contact between the release layer and the deflection roll) and was fed to the calender roll.

The printing plates produced were subjected to adhesion measurements. The adhesion of the protective cover sheet to the release layer and the adhesion of the release layer to the photosensitive layer were determined.

Parameters of the adhesion measurements: Zwick tensile strength tester, take-off angle 90°, take-off speed 100 mm/min, width of the sample 2 cm.

In the determination of the adhesion of the release layer to the photosensitive layer, the samples were prepared as follows:

The protective cover sheet was removed from the test strip. A piece of self-adhesive tape was applied to one end of the strip. The self-adhesive tape was carefully pulled off together with the release layer and could then be clamped in the tensile strength tester.

The adhesion measurements were repeated after 1 week and 4 weeks. The results are summarized in Table 1. The values are stated in N/2 cm widths.

Simultaneously with the adhesion measurements, the removal of the protective cover sheet was investigated in a practical test. The protective cover sheet was pulled off at all 4 corners from a 30×40 cm plate section. If the release layer became detached by more than 1 cm at a corner, this was recorded as a negative test result (delamination: yes).

TABLE 1

| Release layer pretreatment (current mA) | Inline 0 mA[*] | Inline 100 mA | Inline 200 mA | Offline[**] 200 mA |
|---|---|---|---|---|
| Protective cover sheet adhesion (N/2 cm, after 1 day) | 0.04 | 0.03 | 0.04 | 0.05 |
| Release layer adhesion (N/2 cm, after 1 day) | 0.06 | 0.05 | 0.07 | 0.06 |
| Protective cover sheet adhesion (N/2 cm, after 1 week) | 0.05 | 0.07 | 0.05 | 0.04 |
| Release layer adhesion (N/2 cm, after 1 week) | 0.08 | 0.35 | 1.25 | 0.07 |
| Protective cover sheet adhesion (N/2 cm, after 4 weeks) | 0.04 | 0.06 | 0.04 | 0.05 |
| Release layer adhesion (N/2 cm, after 4 weeks) | 0.06 | 1.25 | ***[] | 0.07 |
| Delaminations (after 1 day) | no | no | no | no |
| Delaminations (after 1 week) | yes | no | no | yes |
| Delaminations (after 4 weeks) | yes | no | no | yes |

[*]No corona treatment
[**]Offline = protective cover sheet was coated with release layer, dried, corona-treated (200 mA) and rolled up. After 2 h, the coated protective cover sheet was unrolled and was fed in over the calender roll during extrusion of the photosensitive layer.
***[]Release layer cannot be pulled off The results were surprising in many respects. The protective cover sheet adhesion was low. The values varied from 0.03 to 0.07 N/2 cm and were independent of the corona treatment. The release layer adhesion was only slightly higher than the protective cover sheet adhesion in the case of plates not subjected to corona treatment. The values were from 0.06 to 0.08 N/2 cm. Furthermore, the corona-treated plates did not exhibit higher release layer adhesion one day after plate production. Only after storage for one week was the effect of the corona treatment evident. The adhesion values increased with the current of the corona treatment. After storage for 4 weeks, the plate treated with 200 mA exhibited ideal behavior. The release layer adhesion was so high that the release layer could no longer be pulled off from the photosensitive layer. On the other hand, the protective cover sheet adhesion remained low even on storage. On the other hand, a protective cover sheet subjected to offline corona treatment showed no increase in adhesion. The adhesion measurements correlated with the results of the practical test. Directly after production, it was possible to pull off the protective cover sheet from all plates without the release layer becoming detached at the edges. After storage, the untreated plate and the plate subjected to offline treatment exhibited pronounced delaminations. The flexographic printing plates subjected to inline treatment performed satisfactorily even after storage for 1 week and for 4 weeks. No delaminations of the release layer at all were found.

It is surprising that the effect of the inline corona treatment occurred after a delay and that the effect of the corona treatment is not eliminated by the melting of the polyamide layer on the calender roll.

EXAMPLE 2

A laminate comprising a 125 μm thick polyester film as stated in Example 1, a 5 μm thick release layer of polyamide as in Example 1 and a photosensitive top layer was produced as follows:

A solution of

| | |
|---|---|
| 10.1 parts | of the three-block copolymer stated in Example 1, |
| 4.7 parts | of a tetrapolymer of 46% of methyl methacrylate, 9% of acrylonitrile, 14% of butadiene and 31% of styrene and |
| 0.2 part | of Acid Blue 92 (C.I. 13 390) in |
| 85 parts | of methylene chloride | was cast on the polyester protective cover sheet provided with a release layer and was dried. A top layer about 50 μm thick was obtained.

A photosensitive layer having the composition of Example 1 but without the addition of Sudan Black was processed in a twin-screw extruder and fed from a slot die into the gap of a two-roll calender. Both calender rolls were heated to 80° C. A 125 μm thick polyester film coated with a mixture of adhesive-forming components was fed in over the upper calender roll. The multilayer laminate comprising protective cover sheet, release layer and top layer was fed in over the lower calender roll. The thickness of the calender gap was 3.0 mm. The resulting multilayer printing plate was taken off by means of a vacuum suction belt, cooled and fabricated.

The corona treatment unit was present between the feed means of the multilayer laminate and the lower calender roll. The web width was 50 cm and the speed was 60 cm/min. The current of the corona treatment was varied from 0 through 100 to 200 mA. The top layer side of the multilayer laminate was corona-treated. Thereafter, the laminate was deflected twice (once with the top layer in contact with the deflection roll) and was fed to the calender roll.

After a storage time of one week, plates were produced from the printing plate. The following processing steps were carried out.

a) Preexposure to UV light from the back without a photographic transparency (F III exposure unit from BASF, 35 seconds)

b) Removal of the protective cover sheet c) Placing of a nyloflex® FAR II test film (BASF) on top d) Main exposure under a film at reduced pressure (F III exposure unit, exposure time 15 min)

e) Washing out of the plate (continuous system VF III from BASF, throughput speed 150 mm/min, developer nylosolv® II from BASF, 30° C., relief height 1000 μm)

f) Drying for 2 hours at 65° C.

g) Postexposure (F III exposure unit, 10 min)

h) Aftertreatment with UV-C light (F III aftertreatment unit from BASF, 10 min).

Further plates were produced, with the difference that washing was carried out for about 50% or 100% longer than required (overwash test, throughput speed 100 and 75 mm/min, respectively). The test plates were evaluated. The evaluation was concerned with whether the test elements (isolated 200 μm dot, 50 μm grid and 2% screen with 60 lines/cm) were correctly formed on the plate with top layer. The results are summarized in Table 2.

TABLE 2

| | 200 μm dot | 50 μm grid | 2% screen, 60 lines/cm |
|---|---|---|---|
| Washout speed 150 mm/min | | | |
| Corona treatment 0 mA | + | + | + |
| Corona treatment 100 mA | + | + | + |
| Corona treatment 200 mA | + | + | + |
| Washout speed 100 mm/min | | | |
| Corona treatment 0 mA | + | + | − |
| Corona treatment 100 mA | + | + | + |
| Corona treatment 200 mA | + | + | + |
| Washout speed 75 mm/min | | | |
| Corona treatment 0 mA | − | − | − |
| Corona treatment 100 mA | + | + | + |
| Corona treatment 200 mA | + | + | + |

Table 2 shows that the test elements of all plates were correctly formed at optimum washout speed. If the plates were overwashed, only the test elements of the corona-treated plates were correctly formed. In the case of the plates which were not corona-treated, the top layer was completely or partly missing. Conclusion: an inline corona treatment of the top layer improves the adhesion between top layer and lower photosensitive layer, with the result that the sensitivity of the plates to overwashing is reduced, ie. the resistance to developer is increased.

EXAMPLE 3

Example 2 was repeated, except that an inline corona treatment of the release layer was carried out as early as during the production of the multilayer laminate comprising protective cover sheet/release layer/top layer, before the top layer solution was poured on (web width 50 cm, web speed 60 cm/min, current 200 mA).

A second inline corona treatment was then carried out as in Example 2, during the production of the actual printing plate. The current chosen was once again 200 mA.

After a storage time of 1 week, the multilayer flexographic printing plates were tested. The release layer could not be pulled off from the top layer. When the protective cover sheet was pulled off, absolutely no delaminations were found. The plates were very stable to overwashing. No delaminations of the top layer from the lower photosensitive layer were found even when the washout time was increased by 100%.

We claim:

1. A process for the production of a photosensitive recording material for producing flexographic printing plates, which comprises calendering a first meltable photosensitive layer to the uppermost layer of a composite element comprising, in the following order, a protective cover sheet, a thermoplastic release layer and, optionally, a second meltable layer which is photosensitive or which is rendered photosensitive before the printing plate is used on the release layer, wherein the surface of the uppermost layer of the composite element or the surface of said first photosensitive layer is subjected to a corona treatment within from about 60 to 600 seconds before contact and wherein the corona-treated layer softens or melts during calendering.

2. A process as defined in claim 1, wherein the photosensitive layer is applied as a melt or as a solution to the composite element and the uppermost layer of the composite element is subjected to the corona treatment.

3. A process as defined in claim 1, wherein the corona treatment is a stage in a continuous process.

4. A process as defined in claim 1, wherein the release layer of the composite element is its uppermost layer and is subjected to the corona treatment.

5. A process as defined in claim 1, wherein said first photosensitive layer is present as a solid photosensitive layer on a dimensionally stable substrate.

6. A process as defined in claim 5, wherein the dimensionally stable substrate carries an adhesion-promoting layer.

7. A process as defined in claim 6, wherein the surface of the adhesion-promoting layer is likewise subjected to a corona treatment before combination with said first photosensitive layer.

8. A process as defined in claim 5, wherein the substrate is a polyester film.

9. A process as defined in claim 1, wherein said first photosensitive layer is produced by extrusion from the melt and, on combination with the composite element, is simultaneously bonded on its opposite side to a dimensionally stable substrate.

10. A process as defined in claim 9, wherein the surface of the dimensionally stable substrate is likewise subjected to a corona treatment before combination with said first photosensitive layer.

11. A process as defined in claim 1, wherein the protective cover sheet is a polyester film.

12. A process as defined in claim 1, wherein said first photosensitive layer is a photopolymerizable layer which contains a polymeric binder, an ethylenically unsaturated compound capable of free radical polymerization and a polymerization initiator which can be activated by actinic radiation.

13. A process as defined in claim 12, wherein the polymeric binder used is an elastomer.

14. A process as defined in claim 1, wherein the release layer consists essentially of a polyamide.

15. A process for the production of a photosensitive recording material for producing flexographic printing plates, which comprises calendering a first meltable photosensitive layer to the uppermost layer of a composite element comprising, in the following order, a protective cover sheet, a thermoplastic release layer and a second meltable layer which is photosensitive or which is rendered photosensitive before the printing plate is used on the release layer, wherein the surface of the uppermost layer of said composite element or the surface of said first photosensitive layer is subjected to a corona treatment immediately before contact and wherein the corona-treated layer softens or melts during calendering.

16. A process as defined in claim 15, wherein said second meltable layer is produced on the release layer by applying a solution of its components and evaporating the solvent.

* * * * *